(12) United States Patent
Park et al.

(10) Patent No.: US 7,176,722 B2
(45) Date of Patent: Feb. 13, 2007

(54) LOW POWER HIGH PERFORMANCE INVERTER CIRCUIT

(75) Inventors: Sung Kye Park, Cheongju-si (KR); Choon Sik Oh, Seoul (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 122 days.

(21) Appl. No.: 11/032,534

(22) Filed: Jan. 10, 2005

(65) Prior Publication Data

US 2006/0017470 A1    Jan. 26, 2006

(30) Foreign Application Priority Data

Jul. 21, 2004  (KR) .................. 10-2004-0056987

(51) Int. Cl.
 *H03K 19/0175*   (2006.01)
(52) U.S. Cl. .......................... 326/83; 326/27
(58) Field of Classification Search .................. 326/26, 326/27, 82, 83
See application file for complete search history.

(56) References Cited

U.S. PATENT DOCUMENTS

| | | | |
|---|---|---|---|
| 5,568,081 A * | 10/1996 | Lui et al. ..................... 327/380 |
| 5,917,343 A | 6/1999 | Shou et al. .................. 326/103 |
| 6,225,838 B1 * | 5/2001 | Lee ............................. 327/108 |
| 6,307,396 B1 * | 10/2001 | Mulatti et al. ................. 326/71 |
| 6,535,034 B1 | 3/2003 | Wong ........................ 327/108 |
| 6,859,084 B2 * | 2/2005 | Stansfield et al. ........... 327/325 |
| 2004/0032289 A1 * | 2/2004 | Stansfield et al. ........... 327/112 |
| 2006/0017470 A1 | 1/2006 | Park et al. .................. 326/121 |

* cited by examiner

*Primary Examiner*—Don Le
(74) *Attorney, Agent, or Firm*—Marshall, Gerstein & Borun LLP

(57) ABSTRACT

A low-power, high-performance inverter circuit comprises first and second inverter circuit portions. The first portion comprises a first inverter, including a first pull-up element and a first pull-down element, for inverting an input signal, a first switching element connected between the first pull-down element and ground for switching the first inverter, and a first diode connected between the first pull-down element and ground in parallel with the first switching element. The second portion comprises a second inverter, including a second pull-up element and a second pull-down element, for inverting an input signal, a second switching element connected between the second pull-up element and a supply voltage terminal for switching the second inverter, and a second diode connected between the second pull-up element and the supply voltage terminal in parallel with the second switching element. An output of the first portion is connected to an input of the second portion.

14 Claims, 3 Drawing Sheets

LOW POWER HIGH PERFORMANCE INVERTER CIRCUIT

BACKGROUND OF THE INVENTION

1. Field of the Invention

The present invention relates to a low-power, high-performance inverter circuit, and more particularly to a low-power, high-performance inverter circuit, which achieves high speed operation by preventing a first node, through which a virtual Vss line passes, or a second node, through which a virtual Vdd line passes, from shifting to an excessively high or low voltage level when the first node is shorted to a supply voltage terminal Vdd or when the second node is shorted to a ground terminal, respectively, due to a resistive defect.

2. Description of the Related Art

As power consumption and device reliability in high-density integrated circuits and systems has received increasing attention, power supply voltage has been decreased. Supply voltage is expected to be lower than 1V, particularly in circuits used in low power devices such as portable computers, mobile phones and personal digital assistants (PDA). It is necessary to reduce the threshold voltage of each transistor to secure low supply voltage and high-performance operating characteristics.

However, if semiconductor memory devices use low supply voltage, gate-source voltage $|V_{GS}|$ is reduced, causing lower performance and increasing leakage current of transistors in a standby state. Various circuit techniques have been proposed to overcome these problems. FIG. 1 illustrates a conventional inverter circuit implemented for overcoming the problems.

As shown in FIG. 1, the conventional inverter circuit includes a first inverter 110 for inverting and outputting an input signal IN, and a second inverter 120 for inverting and outputting a signal INi output from the first inverter 110. The first inverter 110 includes a PMOS P11 for pulling up a node A, and an NMOS N11 for pulling down the node A, and the second inverter 120 includes a PMOS P12 for pulling up a node B, and an NMOS N12 for pulling down the node B.

In order to reduce leakage current in standby mode, the conventional inverter circuit further includes a PMOS P13 coupled between the NMOS N11 and a ground terminal Vss, and an NMOS N13 coupled between the PMOS P12 and a supply voltage terminal Vdd. In active mode, –Vdd and 2Vdd are applied to the gates of the PMOS P13 and the NMOS N13 to turn on the PMOS P13 and the NMOS N13, respectively. In standby mode, Vdd and –Vss are applied to the gates of the PMOS P13 and the NMOS N13 to turn off the PMOS P13 and the NMOS N13, respectively, thereby significantly reducing leakage current in standby mode.

In more detail, the PMOS P13 is turned on in active mode by applying a signal S of –Vdd to the gate of the PMOS P13, so that a node C between the NMOS N11 and the PMOS P13 is at Vss level. If the inverter circuit enters standby mode when the input terminal IN of the first inverter 110 is at low level, the voltage of the node C is gradually increased up to a voltage of Vss+ΔV until the NMOS N11 is reverse-biased. Consequently, the NMOS N11 and the PMOS P13 connected to the node C are all reverse-biased, thereby reducing leakage current. Likewise, the NMOS N13 is turned on in active mode by applying a signal SB of 2Vdd to the gate of the NMOS N13, so that a node D between the PMOS P12 and the NMOS N13 is at Vdd level. If the inverter circuit enters standby mode when the input signal INi of the second inverter 120 is at high level, the voltage of the node D is gradually reduced down to a voltage of Vdd–ΔV until the PMOS P12 is reverse-biased. Consequently, the NMOS N13 and the PMOS P12 connected to the node D are all reverse-biased, thereby reducing leakage current.

Despite the advantage of reduced leakage current in standby mode, the conventional inverter circuit has the following problem. If the node C, through which a virtual Vss line passes, is shorted to the supply voltage terminal Vdd, or if the node D, through which a virtual Vdd line passes, is shorted to the ground terminal Vss, due to a resistive defect such as a short caused by dielectric breakdown or bridging between metal lines, the voltage of the node C shifts to a level near "Vdd" much higher than initially intended, or the voltage of the node D shifts to a level near "Vss" much lower than initially intended, which significantly reduces the circuit operation speed. That is, since the voltage of the node C is near Vdd or the voltage of the node D is near Vss due to the short, it takes a long time to shift the node C back to the ground level Vss or the node D back to the supply voltage level Vdd when switching the inverter circuit from standby mode to active mode at a later time, which causes operation delay of the inverter circuit.

SUMMARY OF THE INVENTION

Therefore, the present invention has been made in view of the above problems, and it is an object of the present invention to provide a low-power, high-performance inverter circuit, which achieves high speed operation by preventing a first node, through which a virtual Vss line passes, or a second node, through which a virtual Vdd line passes, from shifting to an excessively high or low voltage level when the first node is shorted to a supply voltage terminal Vdd or when the second node is shorted to a ground terminal, respectively, due to a resistive defect.

In accordance with one aspect of the present invention, the above and other objects can be accomplished by the provision of a low-power, high-performance inverter circuit comprising a pull-up element for pulling up an output terminal of the inverter circuit; a pull-down element for pulling down the output terminal; a switching element connected between the pull-down element and a ground terminal for switching the pull-up element and the pull-down element; and a diode connected between the pull-down element and the ground terminal so as to be in parallel with the switching element.

Preferably, the pull-up element is a PMOS, the pull-down element is an NMOS, and the switching element is a PMOS.

Preferably, the diode is an NMOS diode or an n+/p diode.

In accordance with another aspect of the present invention, the above and other objects can be accomplished by the provision of a low-power, high-performance inverter circuit comprising a pull-up element for pulling up an output terminal of the inverter circuit; a pull-down element for pulling down the output terminal; a switching element connected between the pull-up element and a supply voltage terminal for switching the pull-up element and the pull-down element; and a diode connected between the pull-up element and the supply voltage terminal in parallel with the switching element.

Preferably, the pull-up element is a PMOS, the pull-down element is an NMOS, and the switching element is an NMOS.

Preferably, the diode is an NMOS diode or an n+/p diode.

In accordance with still another aspect of the present invention, the above and other objects can be accomplished by the provision of a low-power, high-performance inverter circuit comprising at least one first inverter circuit portion comprising a first inverter, including a first pull-up element and a first pull-down element, for inverting and outputting an input signal, a first switching element connected between the first pull-down element and a ground terminal for switching the first inverter, and a first diode connected between the first pull-down element and the ground terminal in parallel with the first switching element; and at least one second inverter circuit portion comprising a second inverter, including a second pull-up element and a second pull-down element, for inverting and outputting an input signal, a second switching element connected between the second pull-up element and a supply voltage terminal for switching the second inverter, and a second diode connected between the second pull-up element and the supply voltage terminal in parallel with the second switching element, wherein an output terminal of the at least one first inverter circuit portion is connected to an input terminal of the at least one second inverter circuit portion.

Preferably, the first pull-up element is a PMOS, the first pull-down element is an NMOS, and the first switching element is a PMOS.

Preferably, the first diode is an NMOS diode or an n+/p diode.

Preferably, the second pull-up element is a PMOS, the second pull-down element is an NMOS, and the second switching element is an NMOS.

Preferably, the second diode is an NMOS diode or an n+/p diode.

In accordance with yet another aspect of the present invention, the above and other objects can be accomplished by the provision of a low-power, high-performance inverter circuit comprising a pull-up element for pulling up an output terminal of the inverter circuit; a pull-down element for pulling down the output terminal; a first switching element connected between the pull-up element and a supply voltage terminal for switching the pull-up element and the pull-down element; a first diode connected between the pull-up element and the supply voltage terminal in parallel with the first switching element; a second switching element connected between the pull-down element and a ground terminal for switching the pull-up element and the pull-down element; and a second diode connected between the pull-down element and the ground terminal in parallel with the second switching element.

Preferably, the pull-up element is a PMOS, and the pull-down element is an NMOS.

Preferably, the first switching element is an NMOS, and the second switching element is a PMOS.

Preferably, each of the first and second diodes is an NMOS diode or an n+/p diode.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
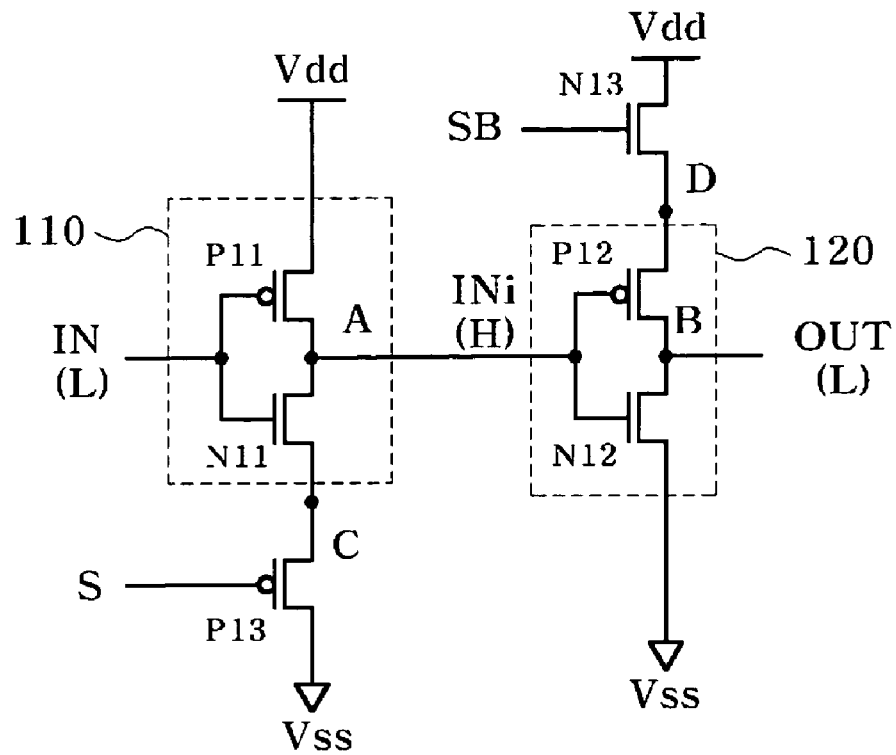
FIG. 1 is a circuit diagram illustrating a conventional inverter circuit implemented for reducing leakage current in standby mode.
Figure 2:
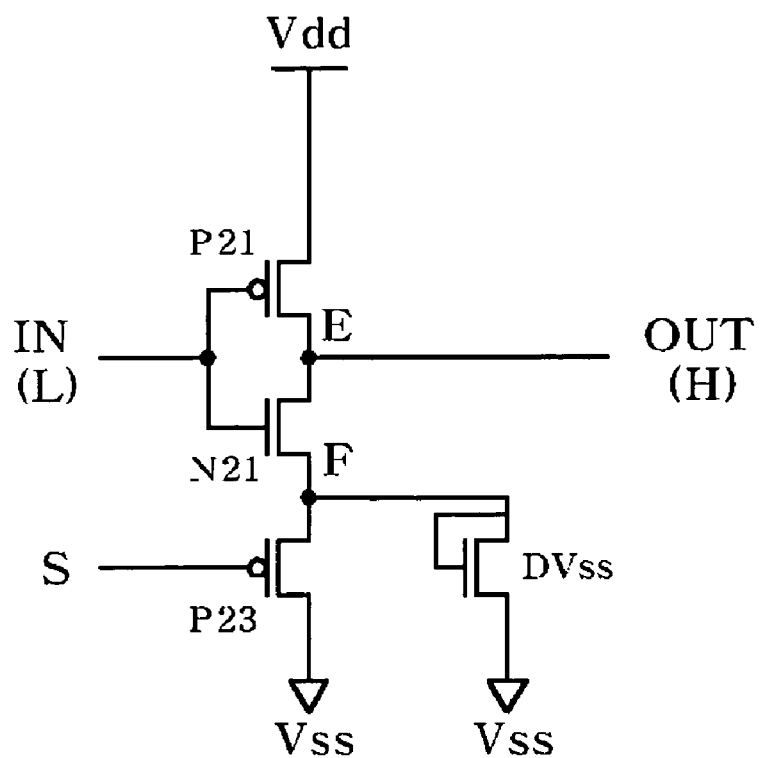
FIG. 2 is a circuit diagram illustrating a low-power, high-performance inverter circuit according to a first embodiment of the present invention.

FIG. 2 is a circuit diagram illustrating a low-power, high-performance inverter circuit according to a first embodiment of the present invention.

As shown in FIG. 2, the inverter circuit according to the first embodiment includes a PMOS P21 that is a pull-up element for pulling up an output terminal E of the inverter circuit, an NMOS N21 that is a pull-down element for pulling down the output terminal E, a PMOS P23 that is a switching element connected between the NMOS N21 and a ground terminal Vss to switch the PMOS P21 and the NMOS N21, and a diode DVss that is connected between the NMOS N21 and the ground terminal Vss in parallel with the PMOS P23.

The inverter circuit according to the first embodiment of the present invention operates in the following manner.

In active mode, a signal S of −Vdd is applied to the gate of the PMOS P23 to turn on the PMOS P23, thereby allowing the inverter circuit to perform inversion. Specifically, if a low-level signal is applied to the input terminal IN of the inverter circuit when the PMOS P23 is turned on, the PMOS P21 is turned on, so that the output terminal E of the inverter circuit becomes high. If a high-level signal is applied to the input terminal IN of the inverter circuit when the PMOS P23 is turned on, the NMOS N21 is turned on, so that the output terminal E of the inverter circuit becomes low. On the other hand, in standby mode, a signal S of Vdd is applied to the gate of the PMOS P23 to turn off the PMOS P23, thereby preventing the inverter circuit from performing inversion.

As described above in the description of the related art, if low threshold voltage transistors are used to increase the operating speed of the inverter circuit, the operating speed in active mode is increased but leakage current in standby mode is also increased, such that it is very inefficient in terms of power consumption. The inverter circuit according to this embodiment uses the PMOS P23 coupled between the NMOS N21 and the ground terminal Vss to significantly reduce the leakage current in standby mode. In more detail, in active mode, −Vdd is applied to the gate of the PMOS P23 to turn on the PMOS P23, so that a node F between the NMOS N21 and the PMOS P23 is at Vss level. If the inverter circuit enters standby mode when the input terminal IN of the inverter circuit is at low level, the voltage of the node F is gradually increased up to a voltage of Vss+ΔV until the NMOS N21 is reverse-biased. Consequently, the NMOS N21 and the PMOS P23 connected to the node F are all reverse-biased, thereby significantly reducing leakage current.

In the inverter circuit according to this embodiment, the diode DVss is connected between the NMOS N21 and the ground terminal Vss in parallel with the PMOS P23 in order to prevent operation delay of the inverter circuit due to a certain resistive defect. For example, if the node F, through which a virtual Vss line passes, is shorted to the supply voltage terminal Vdd due to a resistive defect such as a short caused by dielectric breakdown or bridging between metal lines, the voltage of the node F shifts to a level near "Vdd"

much higher than initially intended. Since the voltage of the node F is near Vdd, it takes a long time to shift the node F back to the ground level Vss when switching the inverter circuit from standby mode to active mode at a later time, which causes operation delays in the inverter circuit.

However, the inverter circuit according to this embodiment includes the diode DVss connected between the NMOS N21 and the ground terminal Vss, so that the voltage difference between the node F and the ground terminal Vss is just as large as a voltage drop caused by the diode DVss. Accordingly, the voltage of the node F can rapidly shift to the ground level Vss when the inverter circuit is switched from standby mode to active mode at a later time, thereby increasing the operation speed of the inverter circuit. Consequently, using the diode DVss coupled between the node F and the ground terminal Vss, the inverter circuit according to this embodiment not only reduces leakage current in standby mode but also can perform fast inversion when it is switched from standby mode to active mode even if a resistive defect causes a short between lines. An NMOS diode or an n+/p diode may be used as the diode DVss.

Figure 3:
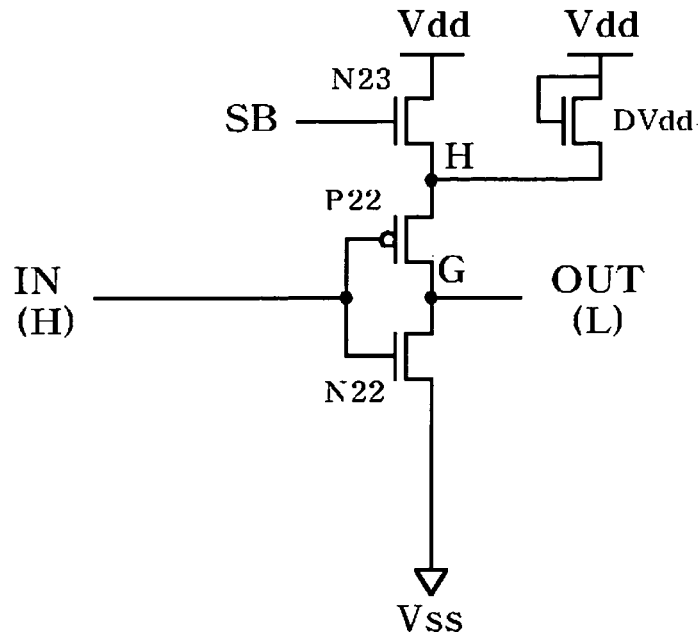
FIG. 3 is a circuit diagram illustrating a low-power, high-performance inverter circuit according to a second embodiment of the present invention.

FIG. 3 is a circuit diagram illustrating a low-power, high-performance inverter circuit according to a second embodiment of the present invention.

As shown in FIG. 3, the inverter circuit according to the second embodiment includes a PMOS P22 that is a pull-up element for pulling up an output terminal G of the inverter circuit, an NMOS N22 that is a pull-down element for pulling down the output terminal G, an NMOS N23 that is a switching element connected between the PMOS P22 and a supply voltage terminal Vdd to switch the PMOS P22 and the NMOS N22, and a diode DVdd that is connected between the PMOS P22 and the power supply terminal Vdd in parallel with the NMOS N23.

The inverter circuit according to the second embodiment of the present invention operates in the following manner.

In active mode, a signal SB of 2Vdd is applied to the gate of the NMOS N23 to turn on the NMOS N23, thereby allowing the inverter circuit to perform inversion. Specifically, if a low-level signal is applied to the input terminal IN of the inverter circuit when the NMOS N23 is turned on, the PMOS P22 is turned on, so that the output node G of the inverter circuit becomes high. If a high-level signal is applied to the input terminal IN of the inverter circuit when the NMOS N23 is turned on, the NMOS N22 is turned on, so that the output node G of the inverter circuit becomes low. On the other hand, in standby mode, a signal SB of −Vss is applied to the gate of the NMOS N23 to turn off the NMOS N23, thereby preventing the inverter circuit from performing inversion.

As in the first embodiment, the inverter circuit according to this embodiment uses the NMOS N23 coupled between the PMOS P22 and the power supply terminal Vdd to significantly reduce the leakage current in standby mode. In more detail, in active mode, 2Vdd is applied to the gate of the NMOS N23 to turn on the NMOS N23, so that a node H between the PMOS P22 and the NMOS N23 is at Vdd level. If the inverter circuit enters standby mode when the input terminal IN of the inverter circuit is at high level, the voltage of the node H is gradually reduced down to a voltage of Vdd−ΔV until the PMOS P22 is reverse-biased. Consequently, the NMOS N23 and the PMOS P22 connected to the node H are all reverse-biased, thereby significantly reducing leakage current.

In the inverter circuit according to this embodiment, the diode DVdd is connected between the PMOS P22 and the power supply terminal Vdd in parallel with the NMOS N23 in order to prevent operation delay of the inverter circuit due to a certain resistive defect. For example, if the node H, through which a virtual Vdd line passes, is shorted to the ground terminal Vss due to a resistive defect, the voltage of the node H shifts to a level near "Vss" much lower than initially intended. Since the voltage of the node H is near Vss, it takes a long time to shift the node H back to the supply voltage level Vdd when switching the inverter circuit from standby mode to active mode at a later time, which causes operation delay of the inverter circuit.

However, the inverter circuit according to this embodiment includes the diode DVdd connected between the PMOS P22 and the power supply terminal Vdd, so that the voltage difference between the node H and the supply voltage terminal Vdd is just as large as a voltage drop caused by the diode DVdd. Accordingly, the voltage of the node H can rapidly shift to the supply voltage level Vdd when the inverter circuit is switched from standby mode to active mode at a later time, thereby increasing the operation speed of the inverter circuit. Consequently, using the diode DVdd coupled between the node H and the supply voltage terminal Vdd, the inverter circuit according to this embodiment not only reduces leakage current in standby mode but also can perform fast inversion when it is switched from standby mode to active mode even if a resistive defect causes a short between lines. An NMOS diode or an n+/p diode may be used as the diode DVdd.

Figure 4:
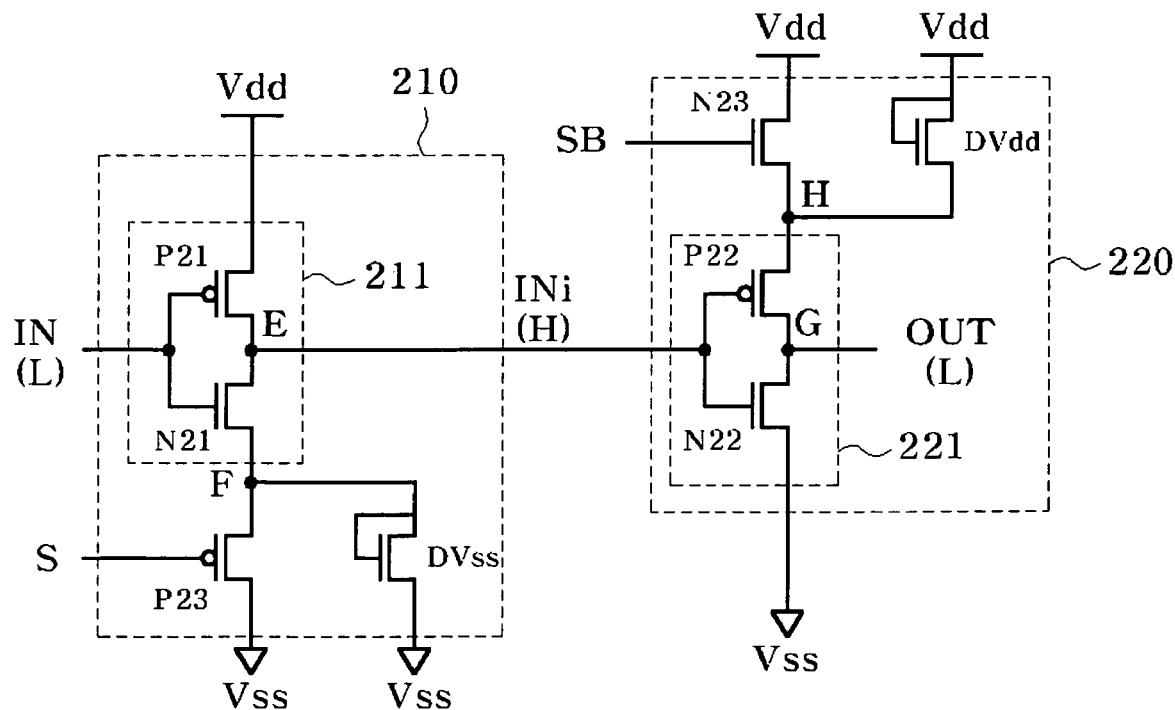
FIG. 4 is a circuit diagram illustrating a low-power, high-performance inverter circuit according to a third embodiment of the present invention.

FIG. 4 is a circuit diagram illustrating a low-power, high-performance inverter circuit according to a third embodiment of the present invention.

As shown in FIG. 4, the inverter circuit according to the second embodiment includes a first inverter circuit portion 210 having the same configuration as the inverter circuit of the first embodiment and a second inverter circuit portion 220 having the same configuration as the inverter circuit of the second embodiment.

The inverter circuit in this embodiment inverts an input signal IN, and then re-inverts and outputs the inverted signal as an output signal OUT. The first inverter circuit portion 210 operates in the same manner as the inverter circuit of the first embodiment, and the second inverter circuit portion 220 operates in the same manner as the inverter circuit of the second embodiment. Using the diodes DVss and DVdd, the inverter circuit in this embodiment not only reduces leakage current in standby mode but also enables each of the two inverter circuit portions 210 and 220 to perform fast inversion when it is switched from standby mode to active mode even if a resistive defect causes a short between lines. An NMOS diode or an n+/p diode may be used as each of the diodes DVss and DVdd.

Figure 5:
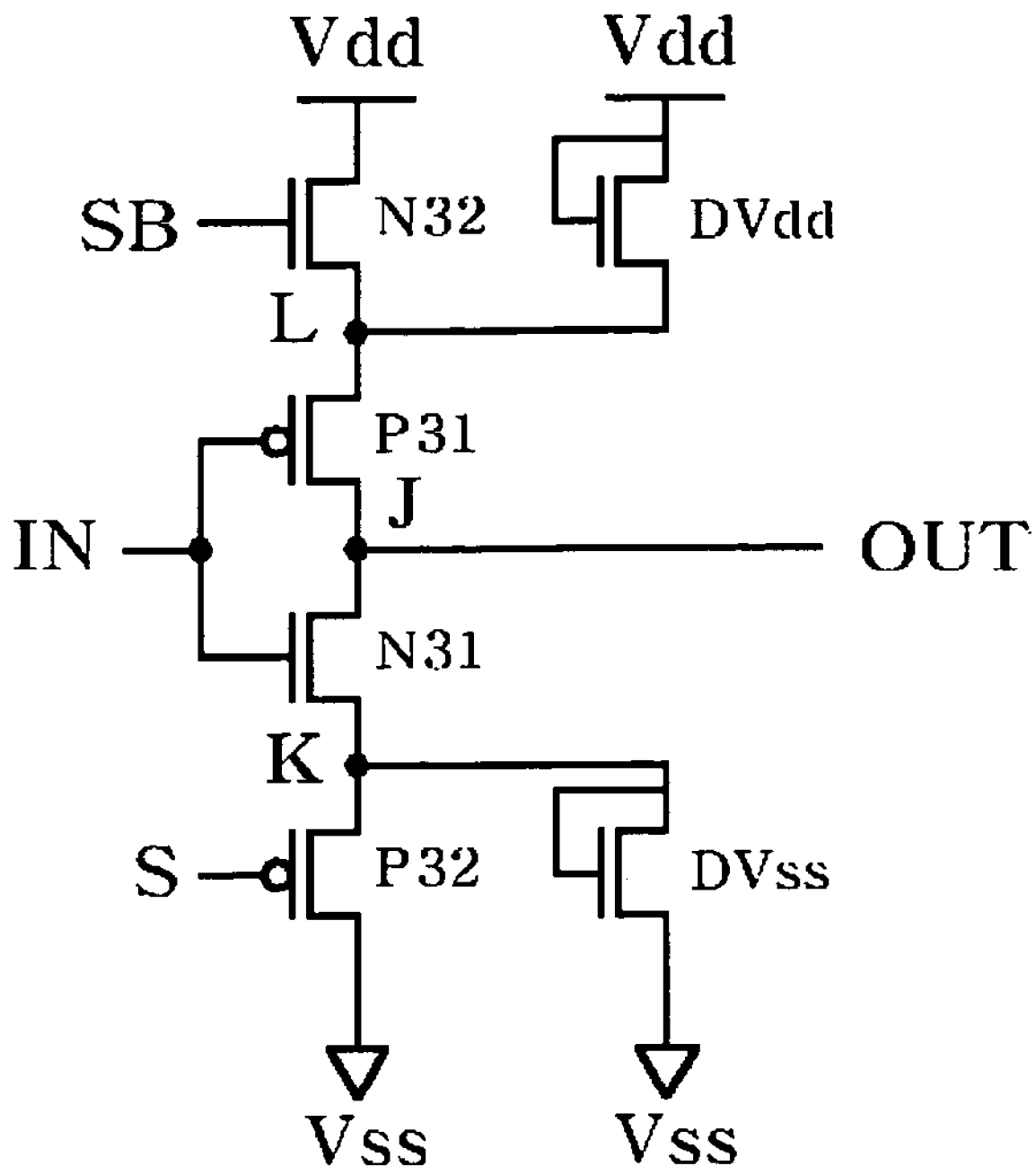
FIG. 5 is a circuit diagram illustrating a low-power, high-performance inverter circuit according to a fourth embodiment of the present invention.

FIG. 5 is a circuit diagram illustrating a low-power, high-performance inverter circuit according to a fourth embodiment of the present invention.

As shown in FIG. 5, the inverter circuit according to the forth embodiment includes a PMOS P31 that is a pull-up element for pulling up an output terminal J of the inverter circuit, an NMOS N31 that is a pull-down element for pulling down the output terminal J, an NMOS N32 that is a switching element connected between the PMOS P31 and a supply voltage terminal Vdd to switch the PMOS P31 and the NMOS N31, a first diode DVdd that is connected between the PMOS P31 and the power supply terminal Vdd in parallel with the NMOS N32, a PMOS P32 that is a switching element connected between the NMOS N31 and a ground terminal Vss to switch the PMOS P31 and the NMOS N31, and a second diode DVss that is connected between the NMOS N31 and the ground terminal Vss in parallel with the PMOS P32.

The inverter circuit according to the fourth embodiment of the present invention operates in the following manner.

In active mode, a signal SB of 2Vdd is applied to the gate of the NMOS N32 to turn on the NMOS N32, and a signal S of −Vdd is applied to the gate of the PMOS P32 to turn on the PMOS P32, thereby allowing the inverter circuit to perform inversion. On the other hand, in standby mode, a signal SB of −Vss is applied to the gate of the NMOS N32 to turn off the NMOS N32, and a signal S of Vdd is applied to the gate of the PMOS P32 to turn off the PMOS P32, thereby preventing the inverter circuit from performing inversion.

As in the first embodiment, the inverter circuit according to this embodiment uses the PMOS P32 coupled between the NMOS N31 and the ground terminal Vss and the NMOS N32 coupled between the PMOS P31 and the power supply terminal Vdd to significantly reduce the leakage current in standby mode.

In more detail, in active mode, −Vdd is applied to the gate of the PMOS P32 to turn on the PMOS P32, so that a node K between the NMOS N31 and the PMOS P32 is at Vss level, whereas 2Vdd is applied to the gate of the NMOS N32 to turn on the NMOS N32 so that a node L between the PMOS P31 and the NMOS N32 is at Vdd level. If the inverter circuit enters standby mode when the input terminal IN of the inverter circuit is at low level, the voltage of the node K is gradually increased up to a voltage of Vss+ΔV until the NMOS N31 is reverse-biased. Accordingly, the NMOS N31 and the PMOS P32 connected to the node K are all reverse-biased. If the inverter circuit enters standby mode when the input terminal IN of the inverter circuit is at high level, the voltage of the node L is gradually reduced down to a voltage of Vdd−ΔV until the PMOS P31 is reverse-biased. Accordingly, the NMOS N32 and the PMOS P31 connected to the node H are all reverse-biased. Consequently, the inverter circuit according to this embodiment reduces leakage current in standby mode using the PMOS P32 and the NMOS N32.

In the inverter circuit according to this embodiment, the second diode DVss is connected between the NMOS N31 and the ground terminal Vss in parallel with the PMOS P32, and the first diode DVdd is connected between the PMOS P31 and the power supply terminal Vdd in parallel with the NMOS N32 in order to prevent operation delay of the inverter circuit due to a certain resistive defect.

For example, if the node K is shorted to the supply voltage terminal Vdd due to a resistive defect, the voltage of the node K shifts to a level near "Vdd", so that it takes a long time to shift the node K back to the ground level Vss when switching the inverter circuit from standby mode to active mode at a later time, which causes operation delay of the inverter circuit. However, the inverter circuit according to this embodiment includes the second diode DVss connected between the NMOS N31 and the ground terminal Vss, so that the voltage difference between the node K and the ground terminal Vss is just as large as a voltage drop caused by the second diode DVss. Accordingly, the voltage of the node K can rapidly shift to the ground level Vss when the inverter circuit is switched from standby mode to active mode at a later time, thereby increasing the operation speed of the inverter circuit.

On the other hand, if the node L, through which a virtual Vdd line passes, is shorted to the ground terminal Vss due to a resistive defect, the voltage of the node L shifts to a level near "Vss", so that it takes a long time to shift the node L back to the supply voltage level Vdd when switching the inverter circuit from standby mode to active mode at a later time, which causes operation delay of the inverter circuit. However, the inverter circuit according to this embodiment includes the first diode DVdd connected between the PMOS P31 and the power supply terminal Vdd, so that the voltage difference between the node L and the supply voltage terminal Vdd is just as large as a voltage drop caused by the first diode DVdd. Accordingly, the voltage of the node L can rapidly shift to the supply voltage level Vdd when the inverter circuit is switched from standby mode to active mode at a later time, thereby increasing the operation speed of the inverter circuit.

Consequently, using the first and second diodes DVdd and DVss, the inverter circuit according to this embodiment not only reduces leakage current in standby mode but also can perform fast inversion when it is switched from standby mode to active mode even if a resistive defect causes a short between lines. An NMOS diode or an n+/p diode may be used as each of the diodes DVdd and DVss.

As apparent from the above description, the present invention provides a low-power, high-performance inverter circuit, which not only significantly reduces leakage current in standby mode but also achieves high speed operation when the circuit is switched from standby mode to active mode by preventing a first node, through which a virtual Vss line passes, or a second node, through which a virtual Vdd line passes, from shifting to an excessively high or low voltage level when the first node is shorted to a supply voltage terminal Vdd or when the second node is shorted to a ground terminal, respectively, due to a resistive defect such as a short caused by dielectric breakdown or bridging between metal lines.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low-power, high-performance inverter circuit comprising:
    a pull-up element for pulling up an output terminal of the inverter circuit;
    a pull-down element for pulling down the output terminal;
    a PMOS connected between the pull-down element and a ground terminal for switching the pull-up element and the pull-down element; and
    a diode connected between the pull-down element and the ground terminal so as to be in parallel with the PMOS, wherein a first level voltage is applied to gates of the PMOS in an active mode, and a second level voltage is applied to gates of the PMOS in a standby mode.

2. The inverter circuit according to claim 1, wherein the pull-up element is a PMOS, and the pull-down element is an NMOS.

3. The inverter circuit according to claim 1, wherein the diode is an NMOS diode or an n+/p diode.

4. A low-power, high-performance inverter circuit comprising:
    a pull-up element for pulling up an output terminal of the inverter circuit;
    a pull-down element for pulling down the output terminal;
    an NMOS connected between the pull-up element and a supply voltage terminal for switching the pull-up element and the pull-down element; and a diode connected between the pull-up element and the supply voltage terminal in parallel with the NMOS, wherein a first level voltage is a applied to gates of the NMOS in an active mode, and a second level voltage is applied to gates of the NMOS in a standby mode.

5. The inverter circuit according to claim 4, wherein the pull-up element is a PMOS, and the pull-down element is an NMOS.

6. The inverter circuit according to claim 4, wherein the diode is an NMOS diode or an n+/p diode.

7. A low-power, high-performance inverter circuit comprising:
at least one first inverter circuit portion comprising a first inverter, including a first pull-up element and a first pull-down element, for inverting and outputting an input signal, a first switching element connected between the first pull-down element and a ground terminal for switching the first inverter, and a first diode connected between the first pull-down element and the ground terminal in parallel with the first switching element; and
at least one second inverter circuit portion comprising a second inverter, including a second pull-up element and a second pull-down element, for inverting and outputting an input signal, a second switching element connected between the second pull-up element and a supply voltage terminal for switching the second inverter, and a second diode connected between the second pull-up element and the supply voltage terminal in parallel with the second switching element,
wherein an output terminal of the at least one first inverter circuit portion is connected to an input terminal of the at least one second inverter circuit portion.

8. The inverter circuit according to claim 7, wherein the first pull-up element is a PMOS, the first pull-down element is an NMOS, and the first switching element is a PMOS.

9. The inverter circuit according to claim 7, wherein the first diode is an NMOS diode or an n+/p diode.

10. The inverter circuit according to claim 7, wherein the second pull-up element is a PMOS, the second pull-down element is an NMOS, and the second switching element is an NMOS.

11. The inverter circuit according to claim 7, wherein the second diode is an NMOS diode or an n+/p diode.

12. A low-power, high-performance inverter circuit comprising:
a pull-up element for pulling up an output terminal of the inverter circuit;
a pull-down element for pulling down the output terminal;
an NMOS connected between the pull-up element and a supply voltage terminal for switching the pull-up element and the pull-down element;
a first diode connected between the pull-up element and the supply voltage terminal in parallel with the NMOS;
a PMOS connected between the pull-down element and a ground terminal for switching the pull-up element and the pull-down element; and
a second diode connected between the pull-down element and the ground terminal in parallel with the PMOS,
wherein a first level voltage is applied to gates of the NMOS in an active mode, a second level voltage is applied to gates of the NMOS in a standby mode, a third level voltage is applied to gates of the PMOS in the active mode, and a fourth level voltage is applied to gates of the PMOS in the standby mode.

13. The inverter circuit according to claim 12, wherein the pull-up element is a PMOS, and the pull-down element is an NMOS.

14. The inverter circuit according to claim 12, wherein each of the first and second diodes is an NMOS diode or an n+/p diode.

* * * * *

UNITED STATES PATENT AND TRADEMARK OFFICE
CERTIFICATE OF CORRECTION

| | | |
|---|---|---|
| PATENT NO. | : 7,176,722 B2 | Page 1 of 1 |
| APPLICATION NO. | : 11/032534 | |
| DATED | : February 13, 2007 | |
| INVENTOR(S) | : Sung K. Park et al. | |

It is certified that error appears in the above-identified patent and that said Letters Patent is hereby corrected as shown below:

At Column 9, line 3, "is a applied" should be -- is applied --.

Signed and Sealed this

Seventeenth Day of May, 2011

David J. Kappos
*Director of the United States Patent and Trademark Office*